US006563724B2

(12) United States Patent
Carsten

(10) Patent No.: US 6,563,724 B2
(45) Date of Patent: May 13, 2003

(54) APPARATUS AND METHOD FOR TURNING OFF BJT USED AS SYNCHRONOUS RECTIFIER

(76) Inventor: Bruce W. Carsten, 6410 NW. Sisters Pl., Corvallis, OR (US) 97330-9243

( * ) Notice: Subject to any disclaimer, the term of this patent is extended or adjusted under 35 U.S.C. 154(b) by 0 days.

(21) Appl. No.: 09/971,047

(22) Filed: Oct. 3, 2001

(65) Prior Publication Data
US 2003/0063482 A1 Apr. 3, 2003

(51) Int. Cl.$^7$ ................................................. H02M 5/42
(52) U.S. Cl. ........................ 363/89; 363/127; 327/498; 327/439
(58) Field of Search .............................. 363/89, 88, 90, 363/97, 127, 131; 323/282, 283, 284, 285, 286; 327/531, 434, 482, 439, 529, 498, 333; 307/315, 270, 575, 300, 570

(56) References Cited

U.S. PATENT DOCUMENTS

| | | |
|---|---|---|
| 3,582,758 A | 6/1971 | Gunn |
| 3,909,700 A | 9/1975 | Ferro |
| 3,940,682 A | 2/1976 | Park et al. |
| 4,072,981 A * | 2/1978 | Black et al. ................... 357/46 |
| 4,286,175 A * | 8/1981 | Baker .......................... 327/432 |
| 4,480,201 A * | 10/1984 | Jaeschke ....................... 327/375 |
| 4,716,514 A | 12/1987 | Patel |
| 4,988,898 A * | 1/1991 | Jansson ........................ 326/78 |
| 5,592,071 A * | 1/1997 | Brown ......................... 323/282 |
| 5,905,368 A | 5/1999 | Kolluri et al. |

OTHER PUBLICATIONS

"A New Synchronous Rectifier Using Bipolar Junction Transistor Driven by Current Transformer", Eiji Saki et al, IEEE INTELEC Conference, 1992, pp. 424–429. No Date.

* cited by examiner

Primary Examiner—Rajnikant S. Patel
(74) Attorney, Agent, or Firm—Steven J. Adamson

(57) ABSTRACT

A bipolar junction transistor (BJT) used as a synchronous rectifier (SR) that is turned off by an active electronic device such as a transistor coupled between the base and collector of that SR BJT. The turn-off transistor functions to rapidly remove stored charge from the collector-base junction of the SR BJT when appropriate. Various active electronic devices are discussed as implementations of the turn-off transistor, including bipolar and field effect transistors of same or opposite polarity. Various anti-saturation and base current increasing circuits are also disclosed.

21 Claims, 5 Drawing Sheets

APPARATUS AND METHOD FOR TURNING OFF BJT USED AS SYNCHRONOUS RECTIFIER

CROSS REFERENCE TO RELATED APPLICATIONS

U.S. patent application having Ser. No. 09/971,048, filed Oct. 3, 2001, and entitled Apparatus and Method for Turning Off BJT used as Controlled or Synchronous Rectifier (by the same inventor as herein) which is hereby incorporated by reference as though it were disclosed in its entirety herein. U.S. patent application having Ser. No. 09/971,057, filed Oct. 3, 2001, and entitled Apparatus and Method for Control and Driving BJT used as Synchronous Rectifier (by the same inventor as herein) which is hereby: incorporated by reference as though it were disclosed in its entirety herein. U.S. patent application having Ser. No. 09/971,096, filed Oct. 3, 2001, and entitled Apparatus and Method for Control and Driving BJT used as Controlled Rectifier (by the same inventor as herein) which is hereby incorporated by reference as though it were disclosed in its entirety herein.

FIELD OF THE INVENTION

The present invention relates to synchronous rectifiers and, more specifically, to the rapid, efficient and economical turn-off of a bipolar junction transistor (BJT) used as a synchronous rectifier.

BACKGROUND OF THE INVENTION

DC to DC power converters are typically used to stabilize or isolate a power supply signal from upstream irregularities (i.e., voltage/power surges, momentary power outages, etc.). Various transformer and non-transformer based power converters are known in the art. These power converters typically employ a rectifying device to convert either a transformed AC signal, a chopped DC or a similar signal (depending on the power converter arrangement) into a DC output signal. This output DC signal constitutes a relatively stable power supply signal.

Depending on the range of voltage (and current) for which the power converter is designed, the power converter may be used, for example, in power supplies for personal electronic devices, laptop or personal computers, engineering workstations and Internet servers. While the present invention is particularly concerned with electronic/digital logic circuits, it should be recognized that the teaching of the present invention are applicable to rectifying device operation in any voltage/current range and for any purpose.

For many years the standard power supply voltage level for electronic logic circuits was 5V. Recently, this voltage level has dropped in many instances to 3.3V and 2.5V, and there are plans within the industry to further reduce this voltage level.

As this voltage level drops, however, the forward voltage drop of the rectifying device becomes the dominant source of power loss and inefficiency. For example, a Schottky diode is typically used when a low voltage drop is desired, and a typical Schottky diode has a 500 mV forward voltage drop. This limits the theoretical efficiency of a DC to DC power converter to 80% at two volts output (before other power conversion losses are taken into account). This efficiency limit further drops to less than 67% at one volt output, and 50% at 500 mV output. These efficiency limits are deemed unacceptable.

In addition to concerns about forward voltage drop and other power inefficiencies, power converters and rectifying devices therein are expected to have high power densities. This mandates a higher switching frequency such that less energy is processed in each switching cycle, which in turn permits smaller component sizes. Switching, frequencies have risen from 5 to 20 Khz thirty years ago (where the push was to get above the audible range) up to 100 KHz to 1 MHz at present. Thus, technology that does not support rapid switching is not preferred for most rectification applications.

With respect to known rectifying devices, these include rectifying diodes (PN and Schottky junction in Si, GaAs, etc.) and rectifying transistors (bipolar and field effect). The forward voltage drop of a rectifying diode can be reduced by design, but only to around 300 mV to 200 mV before a point of diminishing returns is reached where increasing reverse leakage current losses outweigh the decreasing conduction losses. This is due to an inherent physical limit of rectifying diodes and does not depend on semiconductor material or whether the construction is that of a conventional P-N junction diode or a Schottky junction diode. For this reason, amongst others, diodes are not desirable as rectifying devices for low voltage level applications.

Rectifying transistors in which transistor driving is in "synchronism" with the direction of current flow across the transistor have increased in popularity due to their favorable forward voltage drops relative to diodes. Typically, the synchronous rectifying transistor is driven "on" to provide a low forward voltage drop when current flow across the rectifying transistor is in a designated forward direction, and is driven "off" to block conduction when current flow across the rectifying transistor would be in the opposite direction.

Both the Bipolar Junction Transistor (BJT) and the Metal-Oxide-Semiconductor Field Effect Transistor (MOSFET) have been used as a synchronous rectifier transistor, also termed a "synchronous rectifier" (SR). Although the BJT has a longer history of use as an SR, the MOSFET is used almost exclusively at present due to its fast switching speed and perceived ease of driving. BJTs are little used at present due to slow switching speeds in general, and a slow turn-off in particular.

The present invention recognizes that the BJT is a conductivity modulated device whereas the MOSFET is not. As a result of this distinction, the BJT can achieve a lower forward voltage drop for a given forward current density and reverse voltage blocking capability. A major technical cost of the lower voltage drop, however, is the presence of a conductivity modulating charge stored during the forward conduction which must be removed before the BJT can sustain a reverse voltage without high leakage currents. Removal of this charge entails a turn-off "storage time" that results in an inherently slower turn-off in BJTs than is achievable with MOSFETs which do not have such a stored charge. The lower conduction voltage of the SR BJT could be used to advantage at lower output voltages, however, if the BJT turn-off speed could be improved (in a cost-effective manner) which is a purpose of the present invention.

Various prior art circuits for turning off a BJT are discussed below after the following definitions and notes. These prior art arrangements include those that turn-off a BJT used as a conventional transistor and those that turn-off a BJT used as a synchronous rectifier.

Definitions and Notes

In the following discussion, and for the remainder of this document, the following definitions and subsequent notes generally apply to circuits using BJTs, as synchronous rectifiers unless otherwise stated or intrinsically implied:

1) A "transistor" is an active (controllable) semiconductor device with at least three electrodes, such that the signal present at one electrode controls the state of conduction between the other two electrodes.

2) The generic term Field Effect Transistor (FET) is used to include the Junction Field Effect Transistor (JFET) as well as the MOSFET, which in turn is used generically for any Insulated Gate FET (or IGFET), including the less commonly used Metal-Insulator-Semiconductor FET (MISFET) device.

3) A "positive" voltage will be that which is normally applied to the collector of a BJT relative to the emitter, or to the drain of a FET relative to the source, when the device is operating as a conventional transistor; a "negative" voltage will be one of reverse polarity.

4) The collector voltage of a BJT will be said to be "above" the emitter voltage when it is of a positive polarity (as defined above), and will be said to be "below" the emitter voltage when it is of a negative polarity, hence "above" is used generally as synonymous with "positive" and "below" is used generally as synonymous with "negative".

5) A "positive" current flow is one which occurs in normally conducting BJTs and FETs, i.e., from collector to emitter, regardless of device polarity; a "negative" current flow is in the reverse direction.

6) A BJT conducting a given collector current with the collector voltage above the base voltage is said to be in a "linear" region of operation, and is not considered to be in an "on" state in switching applications. In the linear region, the collector voltage falls quickly with small increases in base current. When the collector voltage falls below the base voltage the BJT enters a region of "quasi-saturation" where a significant stored charge begins to accumulate in the transistor, and an increasingly large base current is required to lower the collector voltage further. At some relatively high base current the BJT enters the region of "full", "hard" or "deep" saturation where further increases in base current do not cause a significant decrease in collector voltage, and eventually the collector voltage begins to rise slightly with increasing base current. A BJT is thus "on" in switching applications when it is in quasi or deep saturation.

7) A BJT "anti-saturation" circuit is one which decreases the base drive current when the collector voltage falls below some low level, and prevents the BJT from entering deep saturation.

8) A "power" transistor is a relatively high current (typically greater than one ampere) BJT or FET serving as a conventional transistor or, in the present application, as a synchronous rectifier.

9) The essentially symmetrical structure of a BJT allows it to be operated in an "inverted" mode, where the function of the collector and emitter are interchanged. The terms "emitter" and "collector" will be used in their functional context, wherein the magnitude of: the emitter current of a conducting BJT is the sum of the base and collector currents of the same polarity, and is therefore larger in absolute value than either the base or collector current.

10) The structure of a power MOSFET is normally asymmetrical, as are some integrated circuit (IC) FETs, with the body of the FET shorted to the source terminal. Low voltage FETs used in ICs may be essentially symmetrical, with the FET body connected to the substrate or to a supply voltage. In the case of a symmetrical FET construction, the terms "source" and "drain" are used in their functional context in a circuit.

11) An NPN BJT and an N-channel FET are considered to be of the same "polarity" whether the FET is a MOSFET or a JFET.

12) A PNP BJT and a P-channel FET are considered to be of the same polarity and of opposite polarity to an NPN BJT or an N-channel FET.

13) Unless otherwise defined, diodes may consist of: a P-N semiconductor junction; a metal-semiconductor junction (i.e., a Schottky diode); or a diode connected transistor, wherein the base of a BJT is connected to the collector or the gate of a MOSFET is connected to the drain, or a like device.

For a given semiconductor material, the forward voltage drop of a Schottky diode is less than that of a P-N junction diode or a diode connected BJT. The forward conduction voltage drop of a diode connected MOSFET is determined by the drain current vs. gate voltage relationship, which depends significantly on design and construction, but is typically greater than that of a P-N junction diode or diode connected BJT.

14) The terms "rectifier" and "diode" are often used synonymously, although there are distinctions: a rectifier is a device that allows current to pass in only one direction, whereas a diode is (at least functionally) a two terminal device that may be used as a rectifier.

Note that definitions (3), (4) and (5) above are equivalent to conventional usage when applied to NPN BJTs and N-channel FETs, but are the opposite of conventional usage when applied to PNP BJTs and P-channel FETs. This is done to achieve terms in the claims that are independent of the polarity of device used. Also note that:

1) The polarity of an entire circuit may be changed by changing the polarity of all transistors, and reversing the polarity of all diodes, voltage sources and current sources, without changing the essential behavior of the circuit. It is also recognized that FETs may often be substituted for BJTs and vice versa, particularly in a control or logic circuit, without changing the essential nature, function or behavior of the circuit. For this substitution the collector, base and emitter of a BJT are equivalent to the drain, gate and source of a FET, respectively. The principle limitation of device substitution is that devices must remain of the same type when a matching of characteristics is required.

2) BJTs are conventionally considered to be current driven devices, due to the roughly constant ratio between the base drive and collector currents over several decades of current, during which the base-emitter voltage changes by only a few hundred mV. FETs on the other hand are considered to be voltage driven devices, as the gate-source voltage controls the drain current with essentially no gate current flow under steady state conditions.

3) Base current drive for BJTs (e.g., a turn-on or turn-off drive command as discussed below) is usually shown herein as derived from a voltage source, and a current determining resistor, but various well known current source circuits may be used instead.

Prior Art

While there are several prior art techniques for turning-off a BJT, not all of these are applicable to turning-off a BJT used as a synchronous rectifier (SR). This is because BJTs used as an SR must be capable of rapid turn-off when the applied collector-emitter voltage reverses polarity, whereas in conventional BJT implemented circuits the applied voltage does not reverse polarity.

FIG. 1 shows a prior art technique to turn a BJT on and off. In FIG. 1, switch 13 connects resistor 10 to the "V+"positive voltage source 14 to supply a turn-on base current IB1 to BJT 1. Turn-off is accomplished by opening switch 13 and closing switch 15 (as indicated in dashed lines) such that resistor 10 is now coupled to the "V−", negative voltage source 16. A negative base current IB2 is drawn from BJT 1 until it turns off and ceases to conduct significant collector current with an applied voltage, whereafter the base voltage swings negative to V− and base current flow ceases. Voltage sources 14 and 16 are usually in the range of 5–10 V and similar in magnitude and, being somewhat greater than the base-emitter voltage of BJT 1 (typically less than 1 V), the turn-on base current IB1 and turn-off base current IB2 are also similar in magnitude which provides an acceptable switching speed for some applications. For other applications, a "speed-up" capacitor 20 may be placed in parallel with resistor 10 for extra base drive at turn-on and turn-off. This circuit may also be used for SR applications, as long as the magnitude of V– on 16 is greater than the most negative voltage on the collector of BJT 1. If the collector voltage on BJT 1 becomes more negative than V–, then a positive base current flows through the base-collector junction of BJT 1, turning it on in the inverted mode, thus preventing it from functioning as a rectifier. A drawback of this turn-off approach is the requirement for an additional, negative drive supply voltage greater in magnitude that the most negative BJT 1 collector voltage. The turn-off switching speed is typically too slow for SR applications, due to an overdrive into deep saturation at lower collector currents and similar IB1 and IB2 magnitudes.

FIG. 2 illustrates another prior art approach for driving a BJT that utilizes a transformer. When switch 13 is closed, current ID1 flowing through resistor 11 from voltage source 14 is transformed by transformer 17 to base current IB1 in BJT 1, turning the transistor on. Opening switch 13 and closing switch 15 (as indicated in dashed lines) causes the current ID2 in resistor 11 to flow through an oppositely phased winding of 17, causing the negative turn-off base current IB2 to flow. Current IB2 is again usually similar in magnitude to IB1, and switching speed is similar to that achieved in FIG. 1. Advantages of the embodiment of FIG. 2 include only a single base drive supply voltage and that the transformer drive allows BJT 1 to be isolated from the drive circuit. Disadvantages include that the negative base voltage applied during the BJT 1 "off" state must: be larger than the most negative collector voltage, as discussed above. A further disadvantage lies in the use of a drive transformer which is relatively large and generally too expensive for cost sensitive applications. The drive transformer also places limitations on the relative "on" and "off" periods of BJT 1. Finally, a negative collector-emitter voltage causes BJT 1 to conduct in the inverted mode, preventing use of this drive method in SR applications.

FIG. 3 shows a prior art BJT turn-off technique which eliminates both the drive transformer and the need for a negative drive supply voltage by placing a low value resistor 18 between the base and emitter terminals of BJT 1. When switch 13 is closed, voltage source 14 supplies a drive current ID through resistor 12. Part of current ID flows into the base of BJT 1 as IB1, while the remainder flows as IR through resistor 18. When switch 13 is opened, the current IR in resistor 18 supplies a negative base drive current IB2. A disadvantage of this circuit is that the drive current ID must now be larger than the "on" base drive IB1 by the amount of the turn-off current IB2, increasing drive power losses, particularly if a large IB2 current is desired for faster turn-off. The turn-off drive current IB2 also decreases as turn-off progresses and the base-emitter voltage of BJT 1 drops as the stored charge is removed, slowing the turn-off somewhat. Furthermore, the circuit of FIG. 3 cannot be used directly for SR applications because a negative collector voltage causes a reverse current to flow through resistor 18 and the base-collector junction of BJT 1, turning it "on" in the inverted mode.

FIG. 4 shows another prior art technique for turning off a BJT. Resistor 18 of FIG. 3 is replaced by a turn-off transistor 3 placed between the base and emitter of BJT 1. When switch 13 is closed, resistor 10 supplies base current IB1 from voltage source 14. When switch 13 opens and switch 15 closes, a base current IB3 is supplied to BJT 3 from source 14 through resistor 19. Due to the current gain of BJT 3, a very low impedance is provided between the base and emitter of BJT 1. The BJT 1 reverse base current magnitude IB2 can be much larger than IB1, even with IB3 less than IB1, greatly accelerating the turn-off of BJT 1 if the internal base resistance is sufficiently low. This circuit cannot be used for SR applications, however, for the same reason discussed above for the circuit of FIG. 3.

There are additional prior art BJT driving schemes that have been adapted for SR applications. The circuit of FIG. 5 has been extracted from FIG. 5 of U.S. Pat. No. 5,905,368, issued to Kolluri et al., on May 18, 1999, for a Method and Apparatus for Enabling a Step-Up or Step-Down Operation Using a Synchronous Rectifier Circuit (the '368 patent). The '368 patent illustrates a synchronous rectifying BJT Q1 that is a PNP type of transistor instead of the NPN type used for illustration herein. The '368 patent attempts to overcome the limitations of the embodiment of FIG. 3 herein by placing a Schottky diode D3 in series with base-emitter resistor R1. This prevents the turn-on of Q1 in the inverted mode when the collector voltage reverses. The R1–D3 circuit, however, does not provide a turn-off drive when the Q1 collector voltage reverses and turn-off will be relatively slow.

Other prior art circuits provide some form of "self driving" for a BJT used as a SR based on voltages or currents present in the rectification circuit. Examples of these circuits are shown in FIGS. 6 and 7.

FIG. 6 is a reproduction of FIG. 1 of U.S. Pat. No. 4,716,514, issued to Patel on Dec. 29, 1987, for a Synchronous Power Rectifier. When primary side transistors Q1 and Q2 are on and SR Q3 is to conduct, it is turned on by the voltage on the N2 winding of transformer T1 producing a current flow in R1. When Q1 and Q2 turn-off, the voltage on N2 reverses and turns Q3 off (in a manner similar to FIG. 1), while Q4 is turned on by the voltage on the N2 winding of inductor L1 causing a current to flow in resistor R2. A problem arises when Q1 and Q2 turn back on as the voltage on N2 of L1 tries to keep Q4 on when it must be turned off. This problem is solved by the addition of winding N4 to transformer T1 which forces Q4 to turn-off by reversing the base current flow of Q4 through diode D3. Advantages are that no drive voltage supplies are required for turn-on or turn-off, and no additional magnetic devices are required, but disadvantages are several. Extra windings are generally required on the existing magnetics and turn-off drive may be delayed from that which would give the lowest losses. Most importantly, the available drive currents vary with changes in operating voltages; a severe example occurs when the output (Vo) is overloaded and the voltage falls to near zero, providing no drive voltage to turn-on Q4 (when Q3 is off) until the voltage on Q4 becomes relatively high.

Current transformers have been proposed a number of times to drive BJT synchronous rectifiers, as illustrated in U.S. Pat. No. 3,582,758 (issued to Gunn); U.S. Pat. No. 3,909,700 (issued to Ferro) and U.S. Pat. No. 3,940,682 (issued to Park et al). A basic example of this approach is shown in FIG. 7, and the anode (A) and cathode (K) of the illustrated NPN type SR BJT are labeled (note that this labeling is reversed for a PNP type SR BJT). When the voltage on terminal 24 is, somewhat higher than that on terminal 25 a current begins to, flow through windings 22 and 23 of transformer 21 into the base of BJT 1 and turns it on. Under steady state conditions the ratio of collector to base currents is essentially equal to the turns ratio of winding 23 to winding 22. When the voltage on terminal 24 reverses, a reverse current initially flows through winding 22 and produces a negative base drive current through winding 23, which turns BJT 1 off.

Advantages of the current transformer are an optimal level of base drive for varying collector currents, an absolute minimum of base drive power, and no need for base drive voltage sources. Besides the need for a transformer, the greatest disadvantages are a relatively slow turn-on and turn-off unless additional circuitry is employed, as discussed by Eiji Sakai and Koosuke Harada in "A New Synchronous Rectifier Using Bipolar Transistor Driven by Current Transformer", published in the proceedings of the IEEE INTELEC 1992 conference, pp. 424–429.

In view of this and related prior art, a need exists for turning off a BJT used as a synchronous rectifier in a cost effective manner that provides rapid switching, adequate reverse current blocking and the ability to be driven off with lower current drive signals, amongst other characteristics.

SUMMARY OF THE INVENTION

Accordingly, it is an object of the present invention to provide a low cost, high speed manner of turning off a power bipolar junction transistor which is used as a synchronous rectifier.

It is also an object of the present invention to provide such a circuit that operates, with low drive power requirements. For low cost and higher speed performance, it is preferred that no transformers or inductors be required in the power BJT drive circuit. A single drive supply voltage is also preferred.

It is desired that the drive circuit be realizable as a semiconductor integrated circuit (IC) and that the drive IC be located in the same package as the power BJT or even integrated onto the same semiconductor "chip" as the power BJT. Realization as an IC requires that the drive circuit consist almost exclusively of diodes, transistors and resistors, with capacitor requirements limited to small integratable capacitors or external "drive voltage bypass" capacitors.

These and related objects of the present invention are achieved by use of an apparatus and method for turning off a BJT used as synchronous rectifier as described herein.

In one embodiment of the present invention a turn-off transistor is connected between the base and collector of a BJT that functions as a synchronous rectifier (instead of the conventional prior art placement between the base and emitter, as shown in FIG. 4). When the collector-emitter voltage reverses on the SR BJT, the "on" drive current is removed from the base of the SR BJT and a turn-off drive command is applied to the turn-off transistor. This causes the turn-off transistor to rapidly remove stored charge from the SR BJT by discharging its collector-base junction. This in turn results in rapid turn-off of the SR BJT.

The turn-off transistor may be a BJT of the same polarity as the power BJT serving as the SR. Advantages of this arrangement are that only a single drive supply is required, a high turn-off drive current is available, and the turn-off transistor may be readily fabricated in an integrated circuit.

The turn-off transistor may alternatively be a BJT of the opposite polarity to the power BJT, or the turn-off transistor may be a MOSFET or JFET of either polarity.

The present invention may also includes anti-saturation circuity and/or drive current amplifying circuitry.

The attainment of the foregoing and related advantages and features of the invention should be more readily apparent to those skilled in the art, after review of the following more detailed description of the invention taken together with the drawings.

BRIEF DESCRIPTION OF THE DRAWINGS

FIG. 12 includes drive current amplification circuitry.

Figure 1:
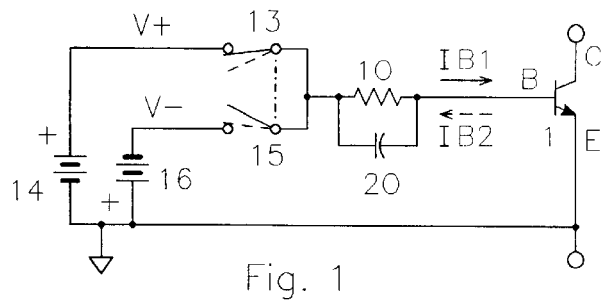
FIGS. 1–4 are schematic diagrams of prior art circuits for turning off a BJT used in a conventional transistor switching circuit.
Figure 2:
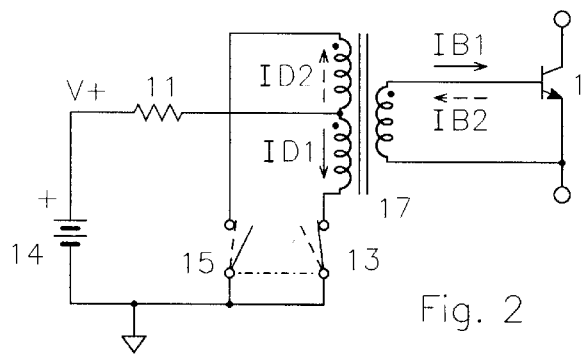
Figure 3:
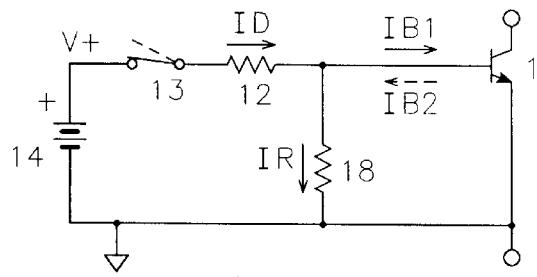
Figure 4:
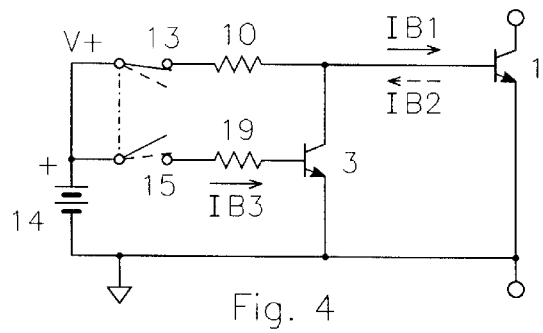
Figure 5:
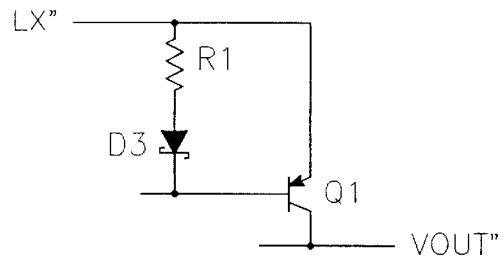
FIGS. 5–7 are schematic diagrams of prior art circuits for turning off a BJT used as a synchronous rectifier.
Figure 6:
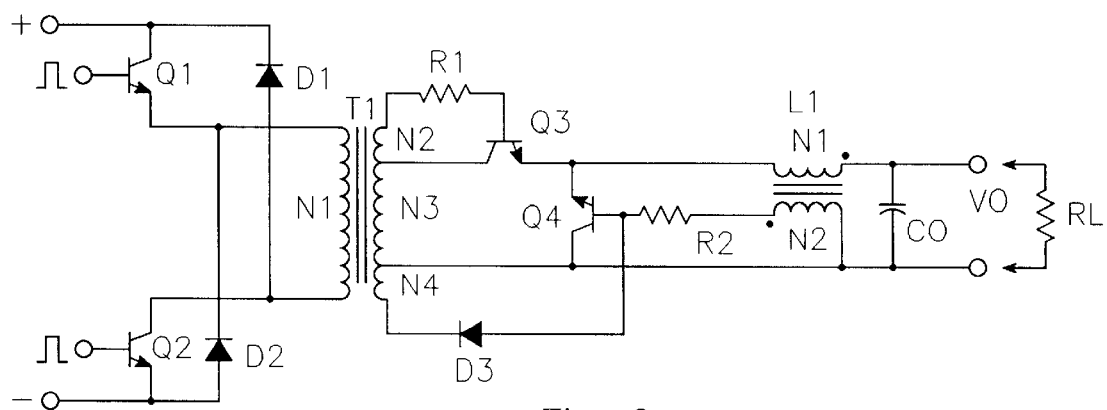
Figure 7:
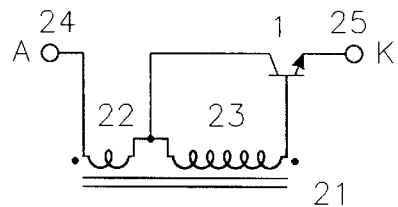

It should be recognized that various figures use the same designators when the similarly designated components serve the same function (with the exceptions of FIGS. 5 and 6 which are reproductions from prior art documents).

DETAILED DESCRIPTION

Figure 8:
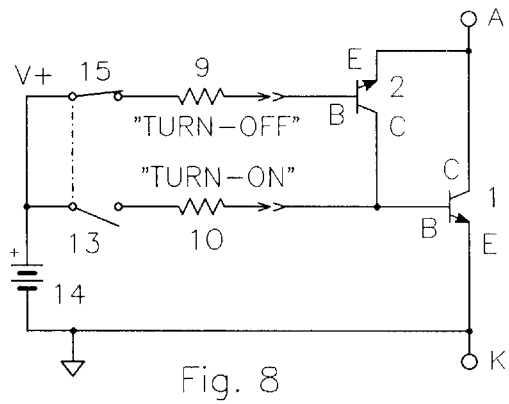
FIG. 8 is a schematic diagram of a circuit for turning off a BJT used as a synchronous rectifier in accordance with the present invention.

Referring to FIG. 8, a schematic diagram of a circuit for turning off a BJT used as a synchronous rectifier (SR) in accordance with the present invention is shown. The circuit of FIG. 8 includes a SR implemented with a BJT 1. In the embodiment of FIG. 8, BJT 1 is preferably an NPN power transistor and has a conventionally arranged collector (C), base (B) and emitter (E). The collector and emitter of BJT 1 are also labeled as the anode (A) and cathode (K) of the SR, respectively, consistent with the direction of current flow in a conventional rectifying diode. Note that for a PNP BJT used as an SR, the collector would function as the SR cathode and the emitter as the SR anode.

An active electronic device is preferably coupled between the base and collector of SR BJT 1 for the purpose of accelerating the turn-off that transistor. In the embodiment of FIG. 8, the active electronic device is implemented as a BJT 2 and this "turn-off" BJT is also an NPN type transistor. The collector, base and emitter of turn-off transistor 2 are appropriately labeled (C,B,E) and it can be seen that the collector of BJT 2 is coupled to the base of BJT 1 and the emitter of BJT 2 is coupled to the collector of BJT 1.

A pair of function representing switches, 13 and 15 selectively couple a drive signal through resistor 10 or 9 to BJTs 1 and 2, respectively. It should be recognized that switches 13 and 15 and current forming resistors 10 and 9 are intended to represent the function: of applying drive commands to each of BJTs 1 and 2. This function can be provided in a plurality of ways. For example, as an alternative to the illustrated "switches," sensing and feedback circuits may be utilized that monitor the collector-emitter voltage of BJT 1 and provide appropriate drive current to the bases of BJTs 1 and 2 to turn them on and off as discussed herein. The present invention involves preferred timing and magnitude considerations for the generated drive signals. Outside of these and related considerations, the mechanisms through which the drive commands are generated (as mentioned in note 3 above) are the subject of an above-mentioned co-pending patent application (Docket No. CARS0003) and are largely outside the present invention.

For that reason, in the figures that follow, the drive signal generating circuits are not shown or discussed.

With respect to operation of the embodiment of FIG. 8, when BJT 1 is "on" a base drive current is supplied by the external circuitry of voltage source 14, (closed) switch 13 and resistor 10. During this "on" period a stored charge is built up in BJT 1 which must be removed to accomplish turnoff. BJT 1 is to be turned off when the current flow would reverse in BJT 1, which may be sensed by the collector-emitter voltage approaching zero or going negative. Switch 13 is then opened and switch 15, is closed as shown which removes the turn-on drive current to BJT 1 and provides a turn-off drive current to BJT 2 (through external resistor 9). The turn-off drive current in resistor 9 is typically smaller than the turn-on drive current in resistor 10. Due to the high current gain obtainable with low voltage BJTS, the reverse (turn-off) base current drawn from BJT 1 may be several hundred times greater than the drive current supplied by resistor 9, and thus the stored charge from BJT 1 can be removed very quickly and provide fast turn-off. When the SR BJT is off, the reverse voltage is sustained by the reverse biased base-emitter junction of BJT 1. Once BJT 1 is "off" and the collector voltage is below the emitter voltage, there is still a small minimum apparent "leakage" current which is the turn-off base drive to BJT 2 flowing out of the BJT 2 emitter (unless the turn-off drive is removed after BJT 1 is off).

An advantage of the circuit of FIG. 8 is that a high BJT 1 turn-off drive current is available without the requirement for a negative drive supply voltage. A disadvantage is that BJT 2 will be driven into deep saturation during the BJT 1 "off" period, which will cause BJT 2 to turn-off slowly when it is time to turn power BJT 1 back on and the turn-off drive to BJT 2 is removed.

The undesirable effects of deep saturation of BJT 2 can be overcome, however, by any suitable "anti-saturation" technique. These techniques include, but are not limited to, the following. It should also be recognized that use of a turn-off drive command of sufficiently short duration (long enough to turn the turn-off transistor on, but not long enough to drive it into deep saturation) might be used as a successful anti-saturation technique.

Figure 9:
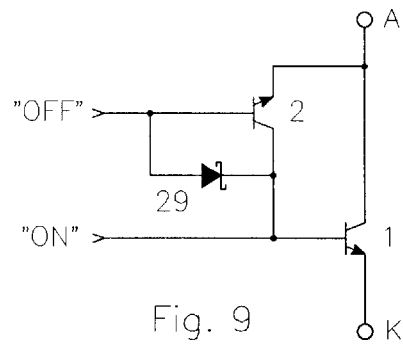
FIGS. 9–12 are schematic diagrams of circuits similar to that of FIG. 8 that incorporate some form of anti-saturation in accordance with the present invention.

Referring to FIG. 9, the circuit of FIG. 8 having an anti-saturation technique in accordance with the present invention is shown. A Schottky diode 29 is placed between the base and collector of BJT 2. When the collector voltage of BJT 2 falls below the base voltage (typically by a few 100 mV) the Schottky rapidly diverts a large part of the base drive current into the collector, preventing a further drop in collector voltage, which is still low enough to ensure a rapid turn-off of BJT 1. A sufficiently "large" conventional (non-Schottky) diode may serve for diode 29, as long as the forward drop is at least about 50–100 mV less than the base-emitter voltage of BJT 2 for the same current.

Figure 10:
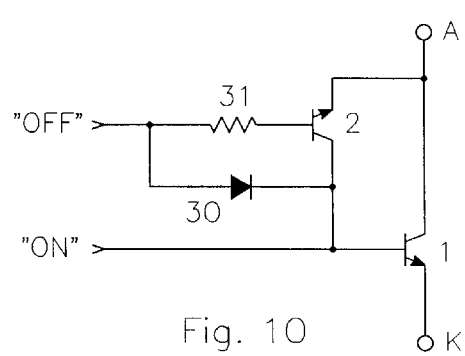
Figure 11:
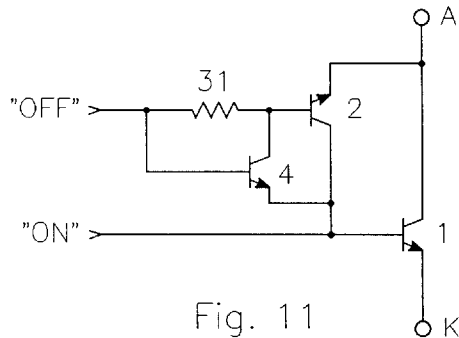
Figure 12:
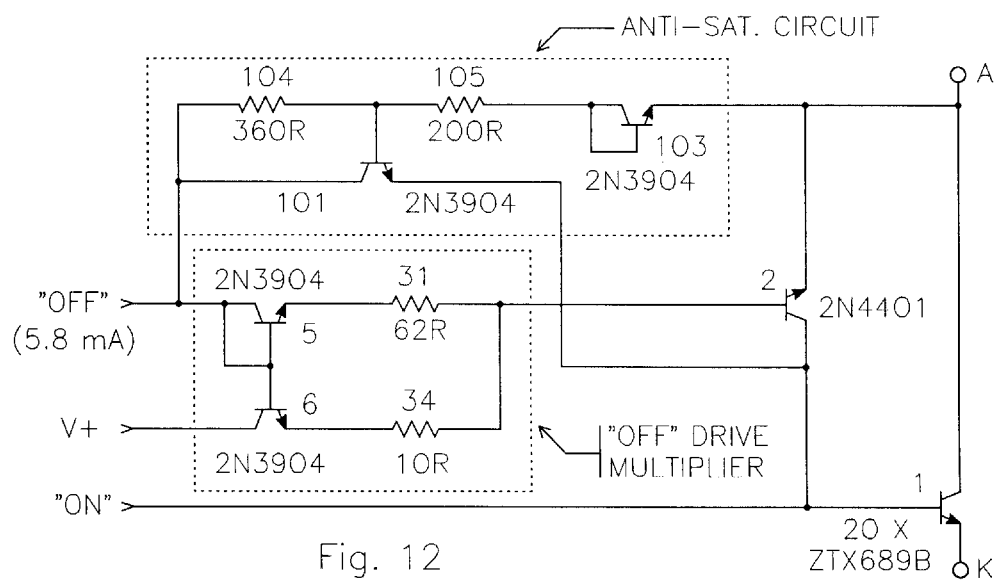

Other circuit techniques to achieve an anti-saturation result are shown in the embodiments of FIGS. 10–12. In FIG. 10, a resistor 31 is placed in the turn-off drive path to the base of BJT 2 and a diode 30 is placed between the "OFF" input end of resistor 31 and the collector of BJT 2. The voltage drop in resistor 31 increases the voltage across the anti-saturation diode 30, and allows a conventional diode to be more readily used. This circuit allows the anti-saturation collector-emitter voltage of BJT 2 to be adjusted somewhat, with an increase in anti-saturation voltage: as the value of resistor 31 is raised. The anti-saturation voltage, however, is less well defined than with the circuit of FIG. 9.

The collector-emitter voltage varies more with changes in collector current and tends towards deep saturation as the collector current drops to the level of the diverted base drive current.

In FIG. 11, the diode 30 of FIG. 10 is replaced with a BJT 4 that has its base coupled to the "OFF" signal input side of resistor 31, its emitter coupled to the collector of BJT 2 and the base of power BJT 1, and its collector coupled to the base of BJT 2. This circuit combines the well defined anti-saturation voltage of the circuit of FIG. 9 with the adjustability of the circuit of FIG. 10. The "anti-saturated" voltage of BJT 2 will essentially be the product of the "off" drive current and the value of resistor 31, when BJTs 2 and 4 have similar characteristics. Thus, the embodiment of FIG. 11 provides a low and well-defined anti-saturation voltage, or "quasi-saturation" voltage (definition 6 above).

Referring to FIG. 12, a schematic diagram of a more preferred circuit for turning off a BJT used as a synchronous rectifier (SR) in accordance with the present invention is shown. The circuit of FIG. 12 is more preferred because it includes several desirable features.

The circuit or embodiment of FIG. 12 is an adaptation of the circuit of FIG. 11 with BJTs 5,6 and resistor 34 added to increase or amplify the turn-off drive current available to BJT 2 over that present at the "OFF" drive input. If, for example, resistor 34 is about ⅙ of the value of resistor 31 (as shown), the total ,off" drive: current available to BJT 2 is nearly seven times greater than that present at the "OFF" drive input. Resistors 104,105 and BJTs 101,103 are added to prevent deep saturation of BJT 2 once BJT 1 is off. The base-emitter voltage (VBE) of BJTs 2 and 103 are similar, so the sum of the voltages on resistors 104,105 is essentially the same as the sum of the VBE of BJT 5 and the voltage on resistor 31, or about 960 mV in this arrangement. The voltage on resistor 105 is a little more than ⅓ of this sum, or about 340 mV. Since the VBE of BJTs 101 and 103 are also similar, BJT 101 conducts and diverts "off" drive away from BJT 5 when BJT 1 is essentially, "off" and the collector-emitter voltage of BJT 2 has fallen to about 340mV.

An advantage of this circuit over that of FIGS. 9–11 is that the total "off" drive current drawn from the drive supply voltage V+ is reduced significantly once BJT 1 turns off. This reduces the steady state "off" drive power. In contrast, the "off" drive current to BJT 2 in FIGS. 9–11 remains constant and is only diverted to the collector of BJT 2 to prevent deep saturation.

Figure 13:
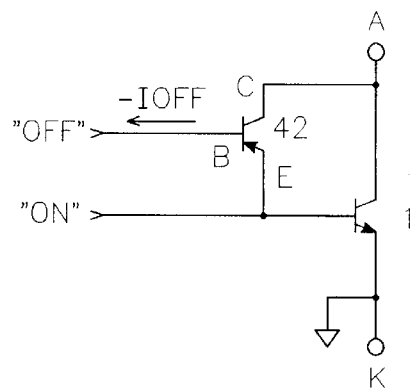
FIGS. 13–23 are schematic diagrams of other circuits for turning off a BJT used as a synchronous rectifier in accordance with the present invention.

Referring to FIG. 13, a schematic diagram of another circuit for turning off a BJT used as a synchronous rectifier (SR) in accordance with the present invention is shown. The embodiment of ° FIG. 13 is similar to that of FIG. 8, but with turn-off BJT 42 now of opposite polarity (PNP) to that of BJT 1 (NPN). The emitter (E), base (B) and collector (C) of BJT 42 are appropriately labeled. A negative (reverse) polarity turn-off drive current is now required from a negative drive supply voltage which is greater in magnitude than the most negative collector voltage on BJT 1. Suitable anti-saturation circuits for BJT 42 are not shown, but are consistent with those discussed above.

Figure 14:
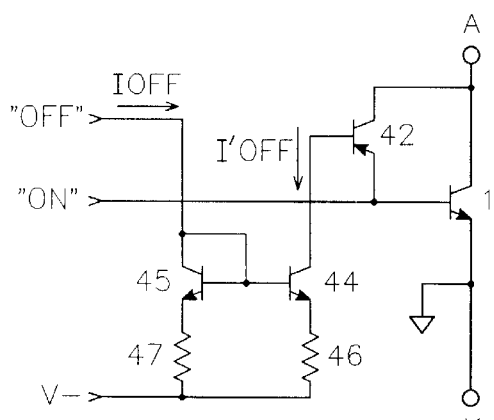

In FIG. 14, a drive "current mirror" consisting of BJTs 44,45 and resistors 46,47 is added to the circuit of FIG. 13 to allow the use of a positive turn-off drive current to BJT 42. If resistors 46,47 are of equal value, then I' off=Ioff, though it should be recognized that the "off" drive current can (for example) be increased by making resistor 46 of lower value than resistor 47. The magnitude of the negative drive supply voltage V− must again be greater in magnitude than the most negative collector voltage on BJT 1.

Figure 15:
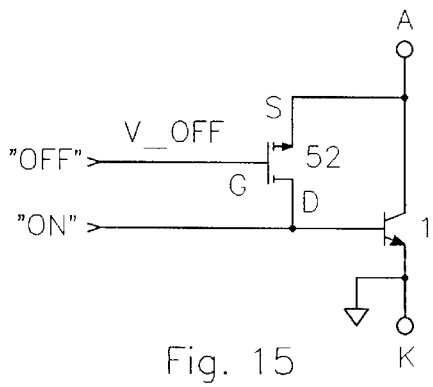

In FIG. 15, an embodiment of the present invention using an N-channel MOSFET 52 for turn-off of BJT 1 is shown. The source (S), gate (G) and drain (D) of transistor 52 are appropriately labeled. N-channel MOSFET 52 is driven by a positive gate drive voltage. FETs do not need an anti-saturation circuit to minimize their turn-off time and a voltage driven FET results in no leakage" current when used as a SR BJT turn-off driver. Note that fabrication of FET and bipolar devices in the same semiconductor substrate is known in the art.

Figure 16:
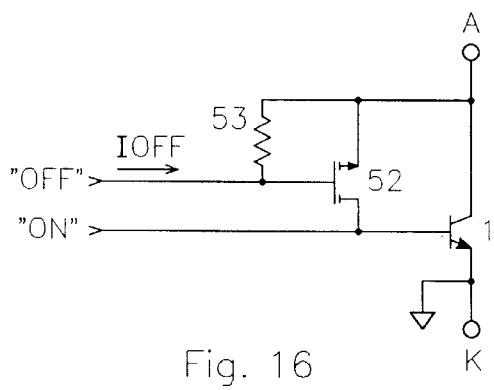

In FIG. 16, an embodiment of the present invention in which a gate-source resistor 53 is added to MOSFET 52 is shown. Resistor 53 allows MOSFET 52 to be driven from a current source as if it were a BJT of the same polarity as BJT 1.

Figure 17:
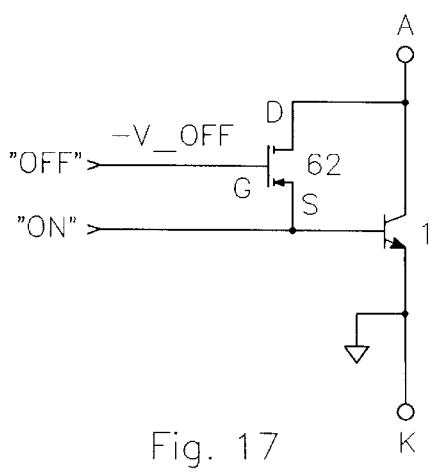

In FIG. 17, an embodiment of the present invention using a P-channel MOSFET 62 as a turn-off transistor is shown. The source (S), gate (G) and drain (D) of transistor 62 are appropriately labeled. P-channel MOSFET 62 requires a negative drive voltage "−V_off" to turn it on (and thereby to turn-off BJT 1).

Figure 18:
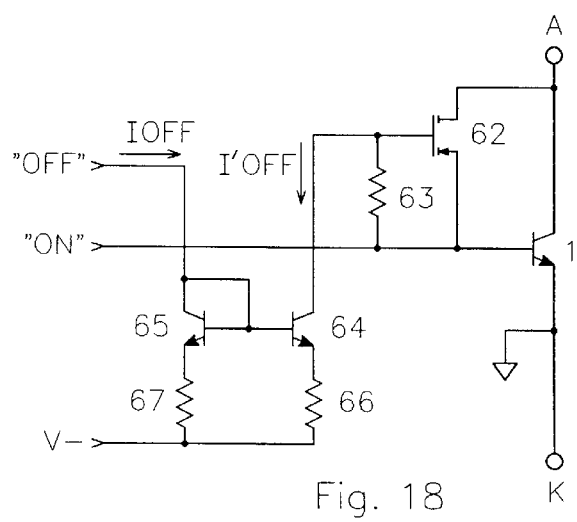

In FIG. 18, an embodiment of the present invention is shown in which a gate-source resistor 63 is added to MOSFET 62 and a current mirror consisting of BJTs 64,65 and resistors 66,67 allows the use of a positive: turn-off current as if a BJT were used of the same polarity as BJT 1. The negative drive supply voltage "V−" must now be greater than the sum of the most negative collector voltage of BJT 1 plus the required negative gate drive voltage of MOSFET 62.

Figure 19:
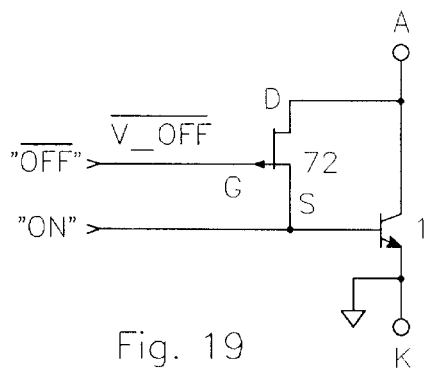

In FIG. 19, an embodiment of the present invention is shown in which a P-channel JFET 72 is used as a turn-off transistor for SR BJT 1. The source (S), gate (G) and drain (D) of transistor 72 are appropriately labeled. JFETs are "normally on" devices with no drive voltage on the gate and require a "reverse" gate voltage (opposite in polarity to the drain voltage) at least equal to the conduction "pinch off" voltage to turn them off. Therefore, a positive gate voltage is removed from the gate of MOSFET 72 when it is to be turned on (to turn-off BJT 1), as indicated by the "bar" over "V_OFF" and the "OFF" input label. The gate drive voltage must be as low as the most negative BJT 1 collector voltage when "removed" in order to have JFET 72 fully "on" when turning BJT 1 off.

Figure 20:
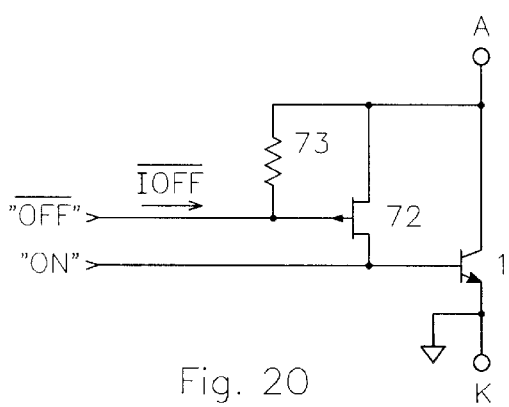

In FIG. 20, an embodiment of the present invention is shown in which a gate-source resistor 73 is added to JFET 72 of FIG. 19. Gate-source resistor 73 allows a positive drive current to be used. The positive drive current is removed (goes to zero) to turn-off BJT 1. An advantage of this embodiment is that a negative drive supply is not required.

Figure 21:
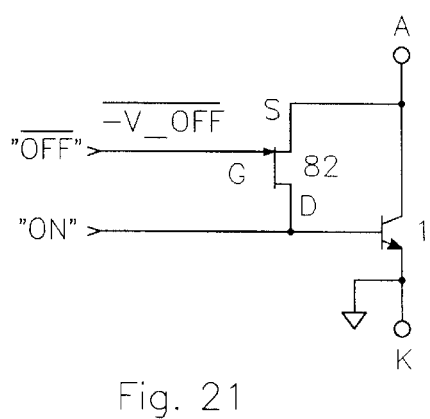

In FIG. 21, an embodiment of the present invention is shown in which an N-channel JFET 82 is used as a BJT 1 turnoff transistor. The source (S), gate (G) and drain (D) of transistor 82 are appropriately labeled. The negative drive voltage is removed from the gate of JFET 82 when BJT 1 is to be turned off. This requires a negative drive supply voltage at least equal to the conduction pinch off voltage of JFET 82.

Figure 22:
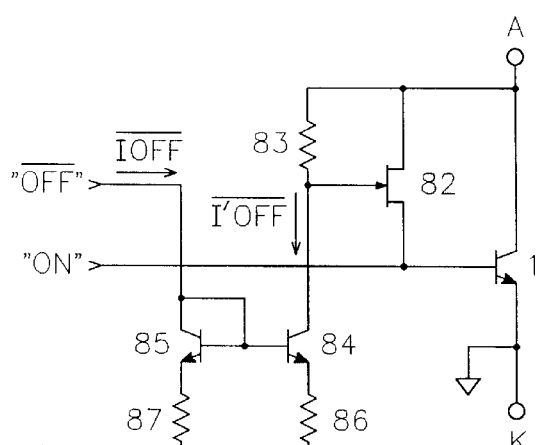

In FIG. 22, an embodiment of, the present invention is shown in which a current mirror consisting of BJTs 84,85 and resistors 86,87 is used along with a gate-source resistor 83 on JFET 82 to allow the use of a positive turn-off drive current to JFET 82. The negative drive supply voltage must be a little greater than the conduction pinch off voltage of JFET 82.

Figure 23:
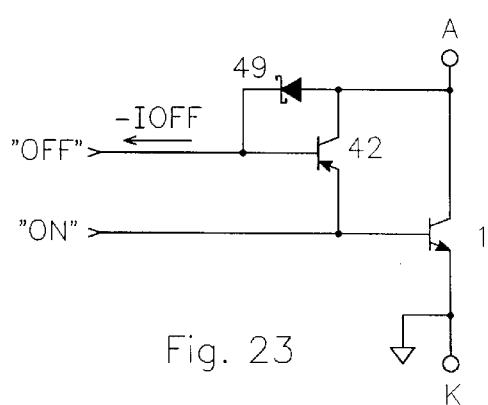

Referring FIG. 23, yet another embodiment of a SR BJT circuit in accordance with the present invention is shown. While several of the above figures, illustrate a different type or polarity of turn-off transistor, FIG. 23 illustrates an anti-saturation circuit for a turn-off BJT that is of opposite polarity than the SR BJT. The turn-off BJT 42 is a PNP type. FIG. 23 is effectively the circuit of FIG. 13 with an anti-saturation circuit (here implemented as a Schottky diode) 49 coupled between the base and the collector of turn-off BJT 42.

From the preceding figures, it becomes apparent that the present invention may be realized in many different embodiments or implementations, depending for example on the SR BJT polarity, turn-off transistor type, turn-off transistor polarity, anti-saturation circuitry, base current amplifying circuitry, etc. The number of combinations becomes exponential. While it is not prudent to include a figure for each of these combinations, it is to be understood that they are within the scope of the present invention.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

What is claimed is:

1. A synchronous rectifier circuit, comprising:

a bipolar junction transistor (BJT) configured for use as a synchronous rectifier (SR) and having collector, base and emitter electrodes, said base electrode being adapted to receive a turn-on drive command for turning on said SR BJT; and a turn-off transistor having first, second and third electrodes that is coupled to said SR BJT between the base and collector of said SR BJT, the first electrode being coupled to the base of the SR BJT, the third electrode being coupled to the collector of the SR BJT and the second electrode being adapted to receive an SR BJT turn-off drive command;

wherein said turn-off transistor is configured, in the absence of a turn-on drive command at the base electrode of said SR BJT and the presence of a turn-off drive command at the second electrode of said turn-off transistor, to conduct stored charge out of the collector-base junction of the SR BJT to thereby rapidly turn-off the SR BJT.

2. The circuit of claim 1, wherein said turn-off transistor is a BJT of the same polarity of the SR BJT and said first, second and third electrodes of the turn-off transistor are the collector, base and emitter electrodes, respectively.

3. The circuit of claim 1, wherein said turn-off transistor is a BJT of the opposite polarity of the SR BJT and said first, second and third electrodes of the turn-off transistor are the emitter, base and collector electrodes, respectively.

4. The circuit of claim 1, wherein said turn-off transistor is a field effect transistor (FET) of the same polarity of the SR BJT and said first, second and third electrodes of the turn-off transistor are the drain, gate and source electrodes, respectively.

5. The circuit of claim 1, wherein said turn-off transistor is a FET of the opposite polarity of the SR BJT and said first, second and third electrodes of the turn-off transistor are the source, gate and drain electrodes, respectively.

6. The circuit of claim 2 or 3, further comprising an anti-saturation circuitry coupled to said turn-off BJT that functions to prevent the turn-off BJT from being driven into deep saturation by a SR BJT turn-off drive command delivered to the base electrode of the turn-off BJT.

7. The circuit of claim 6, wherein said anti-saturation circuitry includes a diode coupled between the collector electrode and the base electrode of the turn-off BJT such that the diode conducts to prevent deep saturation of the turn-off BJT.

8. The circuit of claim 7, wherein said anti-saturation circuitry includes a resistor coupled between an input for a SR BJT turn-off drive command and the base electrode of said turnoff BJT.

9. The circuit of 6, wherein said anti-saturation circuitry includes an anti-saturation transistor coupled between the base electrode and the collector electrode of the turn-off BJT and configured to conduct excess base current away from said turn-off BJT so as to prevent deep saturation of the turn-off BJT when a SR BJT turn-off drive command is delivered to the turn-off BJT.

10. The circuit of claim 9, wherein said anti-saturation circuitry includes a resistor coupled between an input for a SR BJT turn-off drive command and the base electrode of said turn-off BJT.

11. The circuit of claim 1, further comprising:
a turn-off drive command input; and
a circuit coupled between said input and said second electrode of said turn-off transistor that increases the drive command current available at said second electrode over a corresponding drive command current at said input.

12. The circuit of claim 11, further comprising anti-saturation circuitry coupled to said turn-off transistor that prevents said turn-off transistor from being driven into deep saturation.

13. The circuit of claim 12, wherein said anti-saturation circuitry is configured such that a turn-off drive command for the turn-off transistor is of sufficiently short duration so as to not drive that transistor into deep saturation.

14. The circuit of claim 1, further comprising:
a turn-off drive command input; and
a current mirror coupled at least in part between said turn-off drive command input and said second electrode of said turn-off transistor.

15. The circuit of claim 1, wherein said circuit is implemented in a semiconductor substrate integrated circuit.

16. The circuit of claim 1, wherein said circuit is configured to operate such that when the collector voltage of the SR BJT is generally below the emitter voltage of the SR BJT, the base electrode is not receiving a turn-on drive command and the second electrode of the turn-off transistor is receiving a SR BJT turn-off drive command; and when the collector voltage of the SR BJT is generally above the emitter voltage of the SR BJT, the base electrode is receiving a drive command and the second electrode of the turnoff transistor is not receiving a SR BJT turn-off drive command.

17. A synchronous rectifier circuit, comprising:
a bipolar junction transistor (BJT) configured for use as a synchronous rectifier (SR) and having collector, base and emitter electrodes, said base electrode being adapted to receive a turn-on drive command for turning on said SR BJT; and an active electronic device having at least first, second and third terminals that is coupled to said SR BJT between the base and collector thereof, the first terminal being coupled to the base of the SR BJT, the third terminal being coupled to the collector of the SR BJT and the second terminal being adapted to receive an SR BJT turn-off drive command;

wherein said active electronic device is configured, in the absence of a turn-on drive command at the base electrode of said SR BJT and the presence of a turn-off drive command at the second terminal of said active electronic device, to conduct stored charge out of the collector base junction of the SR BJT to thereby rapidly turn-off the SR BJT.

18. The circuit of claim 17, wherein said active electronic device is a transistor from the group of transistors including:
a BJT;
a MOSFET;
a JFET.

19. The circuit of claim 16, wherein the active electronic device is of the same polarity as said SR BJT.

20. The circuit of claim 17, wherein the active electronic device is of a different polarity than said SR BJT.

21. The circuit of claim 17, wherein the active electronic device includes a BJT and anti-saturation circuitry coupled to that BJT so as to prevent deep saturation of that BJT when a SR BJT turn-off drive command is delivered to the active electronic device.

* * * * *